United States Patent
Chen et al.

(10) Patent No.: US 11,415,435 B2
(45) Date of Patent: Aug. 16, 2022

(54) ENCODER AND SIGNAL PROCESSING METHOD USING THE SAME

(71) Applicant: INDUSTRIAL TECHNOLOGY RESEARCH INSTITUTE, Hsinchu (TW)

(72) Inventors: Tsan-Huang Chen, Zhubei (TW); Yu-Chen Lee, Zhudong Township (TW); Chung-Lin Tseng, Taoyuan (TW); Jyun-Liang Lai, Taichung (TW); Yi-Ting Wang, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 275 days.

(21) Appl. No.: 16/917,272

(22) Filed: Jun. 30, 2020

(65) Prior Publication Data

US 2021/0199468 A1    Jul. 1, 2021

(30) Foreign Application Priority Data

Dec. 26, 2019 (TW) .................. 108147916

(51) Int. Cl.
*G01D 5/12* (2006.01)
*H03H 7/06* (2006.01)
*H03M 1/12* (2006.01)

(52) U.S. Cl.
CPC ............... *G01D 5/12* (2013.01); *H03H 7/06* (2013.01); *H03M 1/12* (2013.01)

(58) Field of Classification Search
CPC ........ G01D 5/12; G01D 5/2448; G01D 18/00; H03H 7/06; H03H 17/06; H03H 717/06;
(Continued)

(56) References Cited

U.S. PATENT DOCUMENTS 6,188,341 B1    2/2001   Taniguchi et al.
6,956,505 B2   10/2005   Taniguchi et al.
(Continued)

FOREIGN PATENT DOCUMENTS

CN    ON 104838236 A    8/2015
CN    ON 107748729 A    3/2018
(Continued)

*Primary Examiner* — Jermele M Hollington
*Assistant Examiner* — Courtney G McDonnough
(74) *Attorney, Agent, or Firm* — Birch, Stewart, Kolasch & Birch, LLP (57) ABSTRACT

An encoder and a signal processing method are disclosed. The method includes: receiving an analog signal, and generating a filtered analog signal by an analog filter according to the input signal and a first frequency indication signal; generating a digital signal by an analog-to-digital converter according to the filtered analog signal; generating a filtered digital signal by a digital filter according to the digital signal and a second frequency indication signal; generating a seventh signal and an eighth signal by a dynamic offset calibration unit according to the filtered digital signal and a period indication signal; and generating a position information by a position detection unit according to the seventh signal and the eighth signal. The first frequency indication signal, the second frequency indication signal and the period indication signal are generated by a frequency generation module according to the filtered analog signal or the digital signal.

22 Claims, 11 Drawing Sheets

(58) Field of Classification Search
CPC ...... H03M 1/12; H03M 1/24; G01N 27/9086; G01R 35/005; G01B 7/105
USPC ................. 324/207.25, 202; 702/142, 94, 96
See application file for complete search history.

(56) References Cited

U.S. PATENT DOCUMENTS

| | | |
|---|---|---|
| 7,619,537 B2 | 11/2009 | Taniguchi et al. |
| 8,384,570 B2 | 2/2013 | Hunter |
| 10,309,804 B2 | 6/2019 | Kikuchi et al. |
| 2004/0260499 A1 | 12/2004 | Ito et al. |
| 2005/0182591 A1 | 8/2005 | Taniguchi et al. |
| 2007/0189421 A1 | 8/2007 | Taniguchi et al. |
| 2012/0197591 A1* | 8/2012 | Shinohara ............ G01D 5/2448 324/207.25 |
| 2014/0021341 A1 | 1/2014 | Nagae |

FOREIGN PATENT DOCUMENTS

| | | |
|---|---|---|
| TW | 200529567 A | 9/2005 |
| TW | 200718031 A | 5/2007 |
| TW | 200732630 A | 9/2007 |
| TW | 201015054 A | 4/2010 |
| TW | 201350792 A | 12/2013 |
| TW | 201414988 A | 4/2014 |
| TW | I663383 B | 6/2019 |
| WO | WO 2015/151232 A1 | 10/2015 |

* cited by examiner

ENCODER AND SIGNAL PROCESSING METHOD USING THE SAME

This application claims the benefit of Taiwan application Serial No. 108147916, filed Dec. 26, 2019, the disclosure of which is incorporated by reference herein in its entirety.

TECHNICAL FIELD

The disclosure relates to an encoder and a signal processing method using the same.

BACKGROUND

Rotary encoder is an important element in a motor device. The quality of the rotary encoder has much to do with the quality of the motor device, and the anti-noise performance of the rotary encoder affects the performance of the rotary encoder. Therefore, it has become a prominent task for the industries to improve the anti-noise performance of the rotary encoder.

SUMMARY

According to one embodiment, a signal processing device used in an encoder is disclosed. The signal processing device includes one or more analog filters, one or more analog-to-digital converters, one or more digital filters, a dynamic offset calibration unit, a position detection unit and a frequency generation module. The one or more analog filters are configured to receive one or more analog signals, and to generate one or more filtered analog signal according to the one or more input signals and a first frequency indication signal. The one or more analog-to-digital converters are configured to generate one or more digital signals according to the one or more filtered analog signals. The one or more digital filters are configured to generate one or more filtered digital signals according to the one or more digital signals and a second frequency indication signal. The dynamic offset calibration unit is configured to generate a seventh signal and an eighth signal according to the one or more filtered digital signals and a period indication signal. The position detection unit is configured to generate a position information according to the seventh signal and the eighth signal. The frequency generation module is configured to generate the first frequency indication signal, the second frequency indication signal and the period indication signal according to one of the filtered analog signals or one of the digital signals.

According to another embodiment, a signal processing method used in an encoder is disclosed. The signal processing method includes: receiving one or more analog signals by one or more analog filters, and generating one or more filtered analog signals by the same according to the one or more input signals and a first frequency indication signal; generating one or more digital signals by one or more analog-to-digital converters according to the one or more filtered analog signals; generating one or more filtered digital signals by one or more digital filters according to the one or more digital signals and a second frequency indication signal; generating a seventh signal and an eighth signal by a dynamic offset calibration unit according to the one or more filtered digital signals and a period indication signal; and generating a position information by a position detection unit according to the seventh signal and the eighth signal. The first frequency indication signal, the second frequency indication signal and the period indication signal are generated by a frequency generation module according to one of the filtered analog signals or one of the digital signals.

The above and other aspects of the application will become better understood with regards to the following detailed description of the preferred but non-limiting embodiment(s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1A:
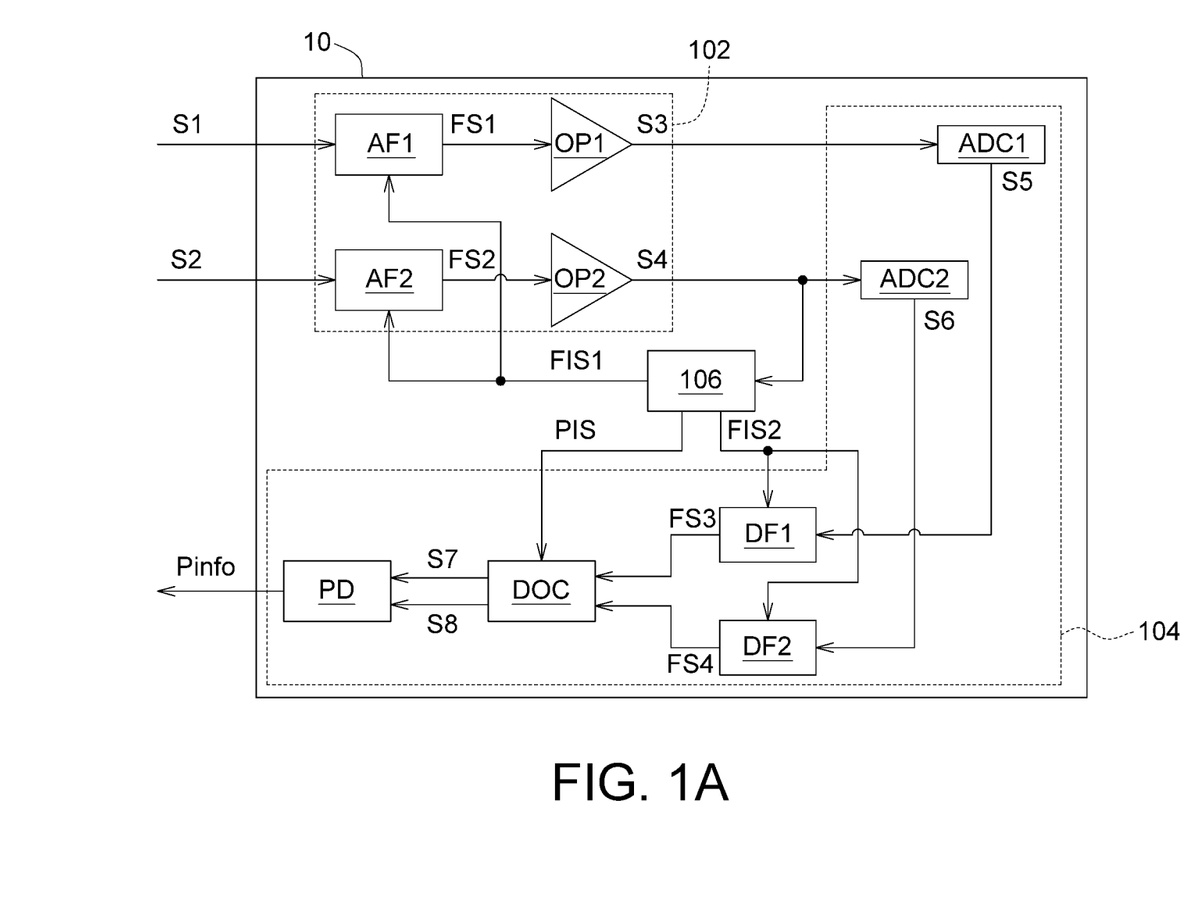
FIG. 1A is a block diagram of an encoder according to an embodiment of the present application.

Referring to FIG. 1A, a block diagram of an encoder according to an embodiment of the present application is shown. The encoder 10 includes an analog processing block 102, a digital processing block 104 and a frequency generation module 106. The analog processing block 102 includes a first analog filter AF1, a second analog filter AF2, a first amplifier OP1 and a second amplifier OP2.

The first analog filter AF1 is configured to receive a first signal S1, and to output a first filtered signal FS1 according to the first signal S1 and a first frequency indication signal FIS1. The second analog filter AF2 is configured to receive a second signal S2, and to output a second filtered signal FS2 according to the second signal S2 and the first frequency indication signal FIS1. In the present embodiment, the first signal S1 can be a sine signal, and the second signal S2 can be a cosine signal. In a practical example, the first analog filter AF1 and the second analog filter AF2 can be coupled to a sensor, configured to sense a parameter (such as the magnetic field) of a rotator of a motor, to obtain a first signal S1 and a second signal S2. The first analog filter AF1 and the second analog filter AF2 are variable frequency filters, that is, the first filter bands of the first analog filter AF1 and the second analog filter AF2 are adjustable. The first analog filter AF1 and the second analog filter AF2 determine the first filter band according to the first frequency indication signal FIS1, and respectively filter the first signal S1 and the second signal S2 according to the first filter band to generate the first filtered signal FS1 and the second filtered signal FS2 respectively.

The first amplifier OP1, coupled to the first analog filter AF1, outputs a third signal S3 according to the first filtered signal FS1. The second amplifier OP2, coupled to the second analog filter AF2, outputs a fourth signal S4 according to the second filtered signal FS2. For example, the first amplifier OP1 has a first gain, by which the first amplifier OP1 amplifies the first filtered signal FS1 to generate the third signal S3. Similarly, the second amplifier OP2 has a second gain, by which the second amplifier OP2 amplifies the second filtered signal FS2 to generate the fourth signal S4.

The digital processing block 104 includes a first analog-to-digital converter ADC1, a second analog-to-digital converter ADC2, a first digital filter DF1, a second digital filter DF2, a dynamic offset calibration unit DOC and a position detection unit PD.

The first analog-to-digital converter ADC1, coupled to the first amplifier OP1, generates a fifth signal S5 according to the third signal S3. The second analog-to-digital converter ADC2, coupled to the second amplifier OP2, generates a sixth signal S6 according to the fourth signal S4. The first analog-to-digital converter ADC1 and the second analog-to-digital converter ADC2 are circuits capable of converting analog signals to digital signals.

The first digital filter DF1, coupled to the first analog-to-digital converter ADC1, generates a third filtered signal FS3 according to the fifth signal S5 and the second frequency indication signal FIS2. The second digital filter DF2, coupled to the second analog-to-digital converter ADC2, generates a fourth filtered signal FS4 according to the sixth signal S6 and the second frequency indication signal FIS2. The first digital filter DF1 and the second digital filter DF2 are variable frequency filters, that is, the second filter bands of the first digital filter DF1 and the second digital filter DF2 are adjustable. The first digital filter DF1 and the second digital filter DF2 determine the second filter band according to the second frequency indication signal FIS2, and respectively filter the fifth signal S5 and the sixth signal S6 according to the second filter bands to generate the third filtered signal FS3 and the fourth filtered signal FS4 respectively.

It should be noted that the first amplifier OP1 and the second amplifier OP2 can be selectively disposed. That is, in some embodiments, the first analog-to-digital converter ADC1 can be coupled to the first analog filter AF1, and the second analog-to-digital converter ADC2 can be coupled to the second analog filter AF2.

The dynamic offset calibration unit DOC, coupled to the first digital filter DF1 and the second digital filter DF2, outputs a seventh signal S7 and an eighth signal S8 according to the third filtered signal FS3, the fourth filtered signal FS4 and a period indication signal PIS. The dynamic offset calibration unit DOC can calibrate the offset of the third filtered signal FS3 and the fourth filtered signal FS4 according to the period indication signal PIS to generate the seventh signal S7 and the eighth signal S8 respectively.

The position detection unit PD outputs a position information Pinfo according to the seventh signal S7 and the eighth signal S8. The position detection unit PD can perform an angle operation on the seventh signal S7 and the eighth signal S8 to obtain the position information Pinfo, such as an angle representing the state of the rotator. In actual application, the position information Pinfo can be inputted to a control chip of the motor and can be used as a basis to generate a control signal by which the rotation speed of the motor is controlled or adjusted.

The frequency generation module 106 is configured to output the first frequency indication signal FIS1, the second frequency indication signal FIS2 and the period indication signal PIS according to the third signal S3, the fourth signal S4, the fifth signal S5 or the sixth signal S6. In the present embodiment (Referring to FIG. 1A), the frequency generation module 106, coupled to the second amplifier OP2 and the second analog-to-digital converter ADC2, generates the first frequency indication signal FIS1, the second frequency indication signal FIS2 and the period indication signal PIS according to the fourth signal S4.

Figure 2A:
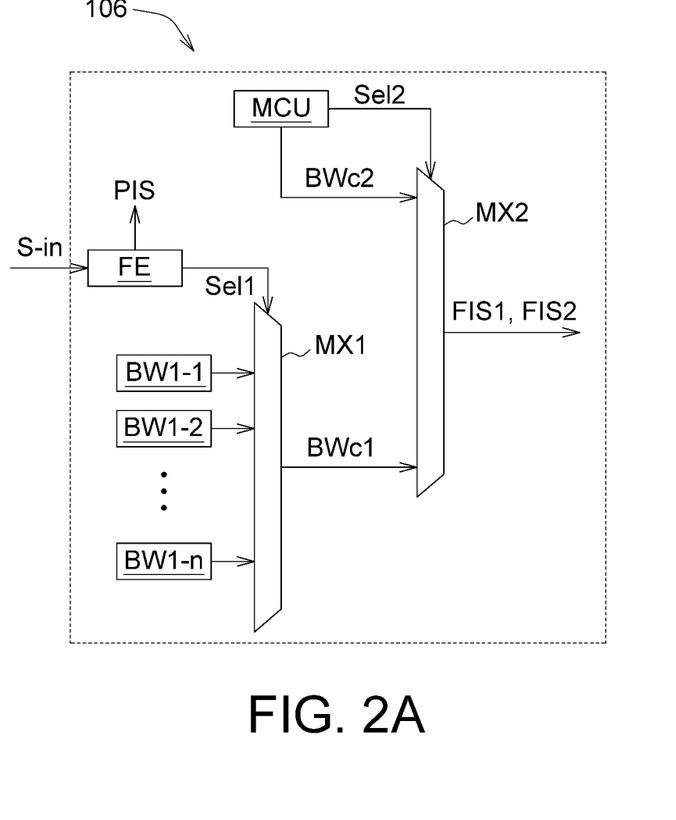
FIG. 2A is a block diagram of a frequency generation module according to an embodiment of the present application.

Referring to FIG. 2A, a block diagram of a frequency generation module according to an embodiment of the present application is shown. The frequency generation module 106 includes a frequency estimator FE, a micro-controller (micro controller unit) MCU, a first multiplexer MX1 and a second multiplexer MX2.

The frequency estimator FE is configured to output the first selection signal Sel1 and the period indication signal PIS according to an input signal S-in (the second filtered signal FS2 that has been amplified, that is, the fourth signal S4). The micro-controller MCU is configured to generate a second selection signal Sel2 and a second candidate band BWc2. In an embodiment, the micro-controller MCU generates the second selection signal Sel2 and the second candidate band BWc2 according to a noise band. The noise band can be user-defined or can be obtained by detecting the frequency of the mechanic noises of the motor. The first multiplexer MX1 is configured to select one of pleural first bands BW1-1~BW1-n as a first candidate band BWc1 according to the first selection signal Sel1. The second multiplexer MX2 is configured to select one of the first candidate band BWc1 and the second candidate band BWc2 according to the second selection signal Sel2, and to output the selected candidate band as the first frequency indication signal FIS1 and the second frequency indication signal FIS2. In other words, in the present embodiment, the first frequency indication signal FIS1 and the second frequency indication signal FIS2 are identical.

Figure 2B:
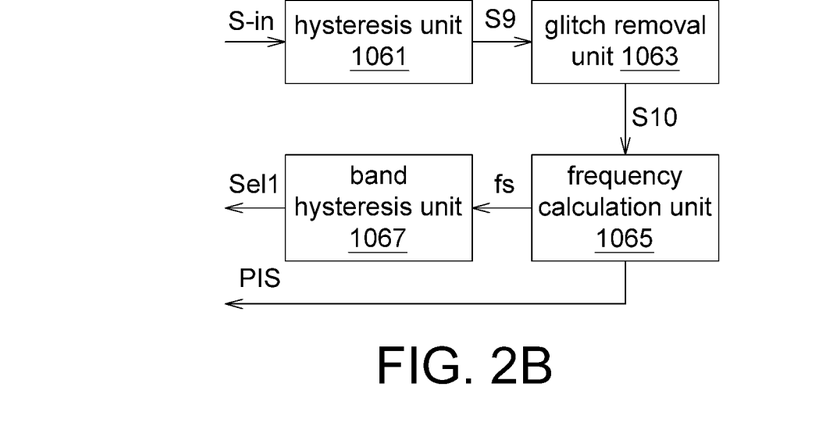
FIG. 2B is a block diagram of a frequency estimator according to an embodiment of the present application.

Referring to FIG. 2B, a block diagram of a frequency estimator according to an embodiment of the present application is shown. Also, referring to FIG. 3A, a wave diagram of a frequency estimator according to an embodiment of the present application is shown. The frequency estimator FE includes a hysteresis unit 1061, a glitch removal unit 1063, a frequency calculation unit 1065 and a band hysteresis unit 1067.

Figure 3A:
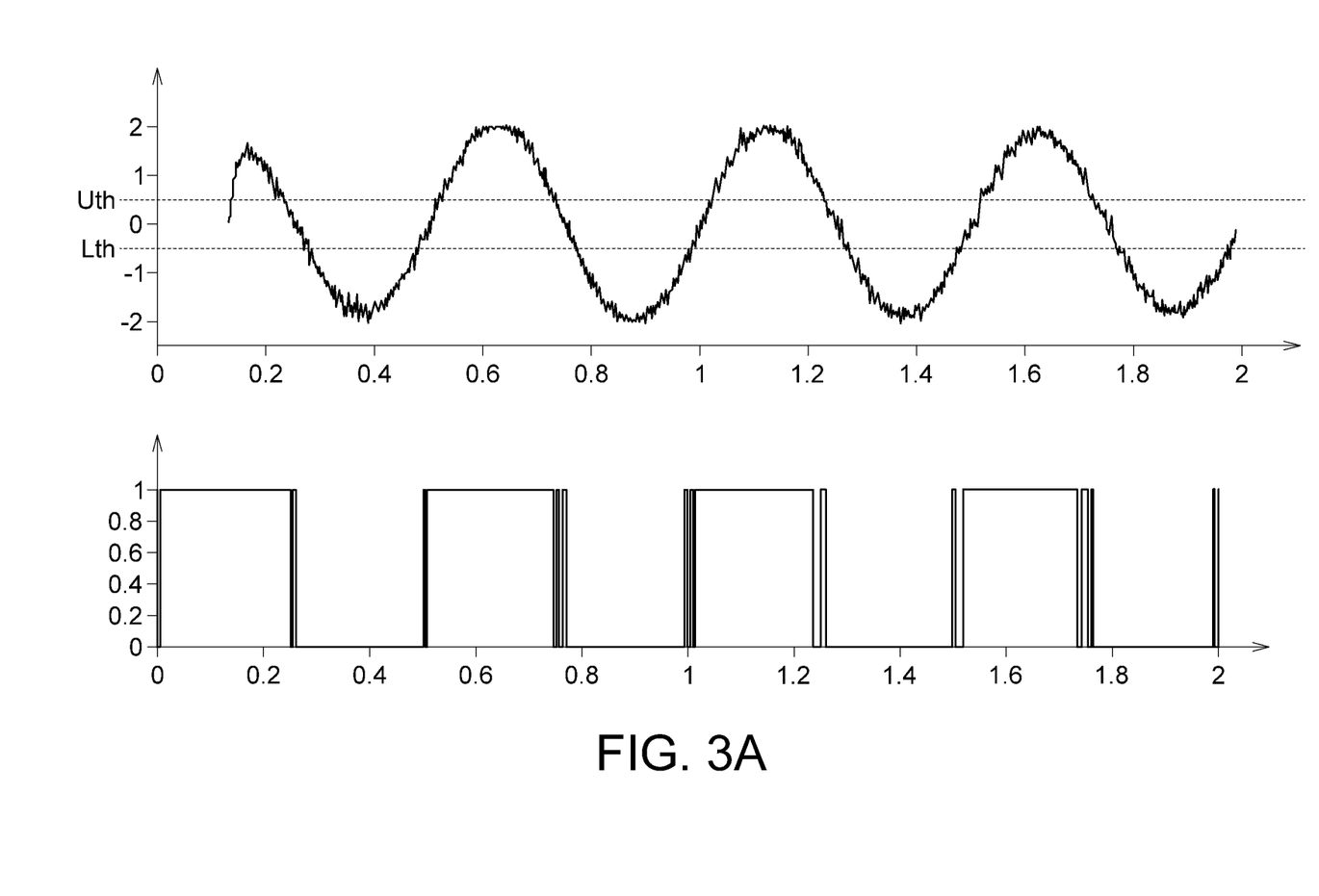
FIG. 3A is a wave diagram of a frequency estimator according to an embodiment of the present application.

The hysteresis unit 1061 is configured to receive the input signal S-in, and to generate a ninth signal S9 according to the input signal S-in, an upper threshold Uth and a lower threshold Lth. To put it in greater details, when the input signal S-in is higher than the upper threshold Uth, the ninth signal S9 is at a high level; when the input signal S-in is lower than the lower threshold Lth, the ninth signal S9 is at a low level; when the input signal S-in changes from being higher than the upper threshold Uth to be not higher than the upper threshold Uth, the ninth signal S9 maintains at the high level; when the input signal S-in changes from being lower than the lower threshold Lth to be not lower than the lower threshold Lth, the ninth signal S9 maintains at the low level. As indicated in FIG. 3A, due to the influence of the noises, the waveform of the input signal S-in may not be a smooth curve, and the waveform of the ninth signal S9 would therefore have a glitch at the transition between the high level and the low level.

The glitch removal unit 1063, coupled to the hysteresis unit 1061, outputs a tenth signal S10 according to the ninth signal S9 and a predetermined time. When the ninth signal S9 changes from a high level to a low level and the low level lasts for predetermined time, the tenth signal S10 changes from the high level to the low level; when the ninth signal S9 changes from the low level to the high level and the high level lasts for predetermined time, the tenth signal S10 changes from the low level to the high level. In practice, the glitch removal unit 1063 may include a counter or a timer configured to determine whether the ninth signal S9 lasts for the predetermined time after the transition between the high level and the low level. Thus, the glitch removal unit 1063 can eliminate the sharp glitch off the ninth signal S9 to avoid making erroneous judgments in subsequent frequency determination.

The frequency calculation unit 1065, coupled to the glitch removal unit 1063, receives a tenth signal S10, and calculates a signal frequency fs according to the tenth signal S10 to generate the period indication signal PIS. The signal frequency fs represents the frequency of the tenth signal S10, and the period indication signal PIS includes the information of the period of the tenth signal S10, such as a reciprocal of the signal frequency fs. For example, the frequency calculation unit 1065 can calculate and use an interval between two adjacent rising edges of the tenth signal S10 within a specific period as the signal frequency fs or can calculate and use an average of the intervals between two adjacent rising edges as the signal frequency fs. However, the calculation methods of frequency is not limited thereto.

Figure 3B:
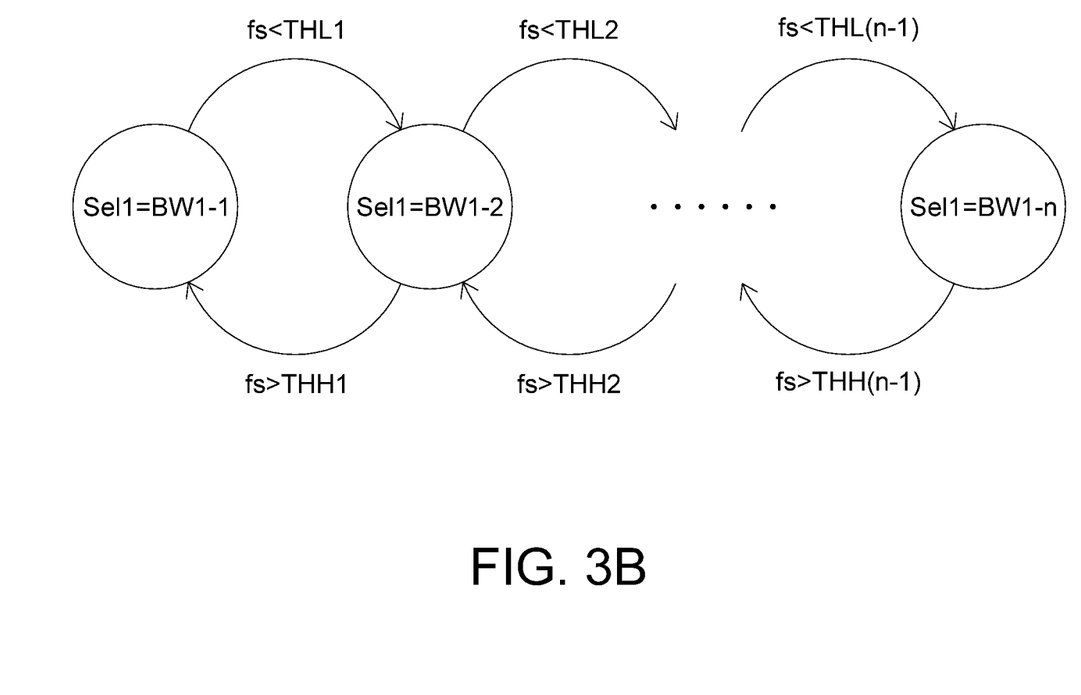
FIG. 3B is a schematic diagram of a state machine of a band hysteresis unit according to an embodiment of the present application.

The band hysteresis unit 1067, coupled to the frequency calculation unit 1065, generates the first selection signal Sel1 according to signal frequency fs. Referring to FIG. 3B, a schematic diagram of a state machine of a band hysteresis unit according to an embodiment of the present application. The band hysteresis unit 1067 may include a state machine as indicated in FIG. 3B, and may determine the first selection signal Sel1 according to the state machine, the signal frequency fs, pleural first thresholds THL1~THL(n−1) and pleural second thresholds THH1~THH(n−1), wherein THH1>THH2> . . . >THH(n−1), THL1>THL2> . . . >THL(n−1), and THL1~THL(n−1), THH1~THH(n−1) are positive real numbers. For example, if the current state of the band hysteresis unit 1067 is "Sel1=BW1-1" and the signal frequency fs is lower than THL1, then the state of the band hysteresis unit 1067 changes from "Sel1=BW1-1" to "Sel1=BW1-2" and is outputted for selecting the first selection signal Sel1 of the first band BW1-2; if the current state of the band hysteresis unit 1067 is "Sel1=BW1-1" and the signal frequency fs is not lower than THL1h, then the state of the band hysteresis unit 1067 maintains at "Sel1=BW1-1", and the first selection signal Sel1 for selecting the first band BW1-1 is outputted.

Figure 1B:
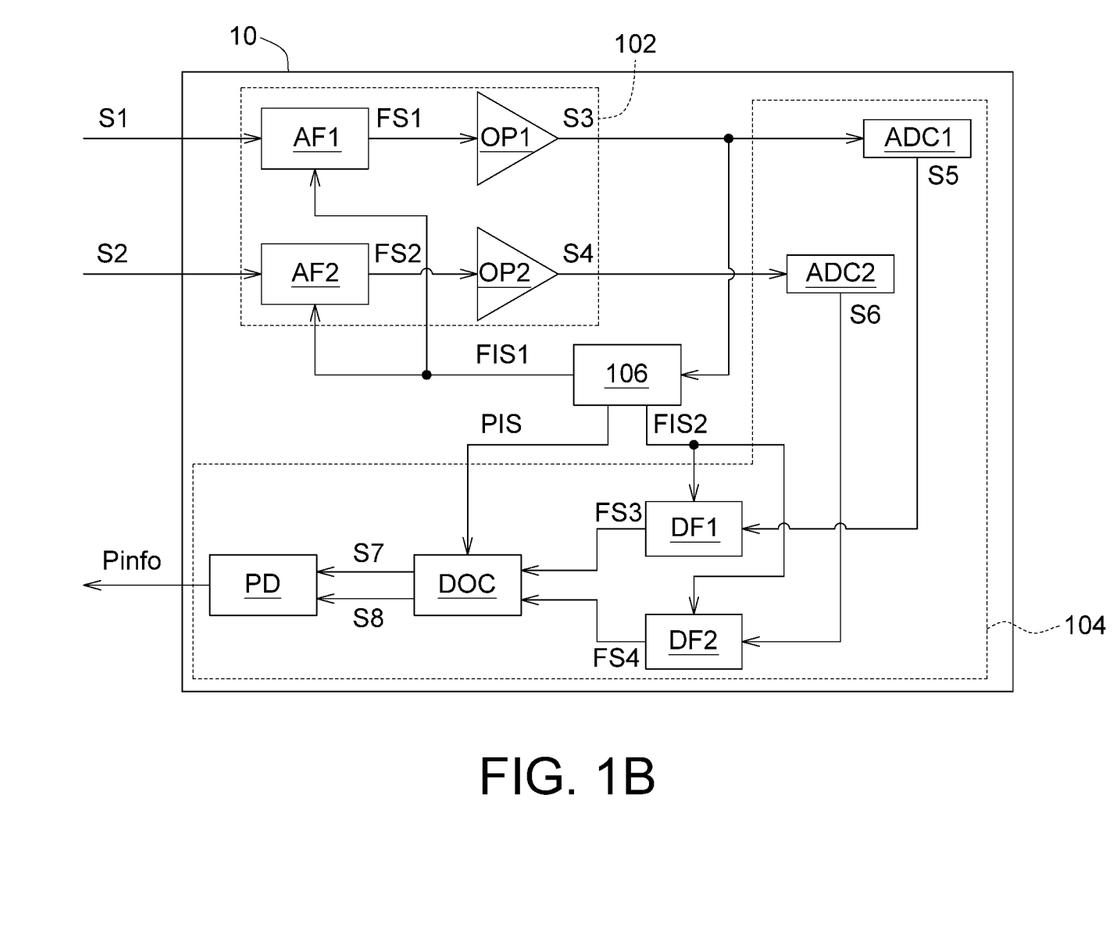
FIGS. 1B-1D respectively are block diagrams of an encoder according to an alternate embodiment of the present application.
Figure 1C:
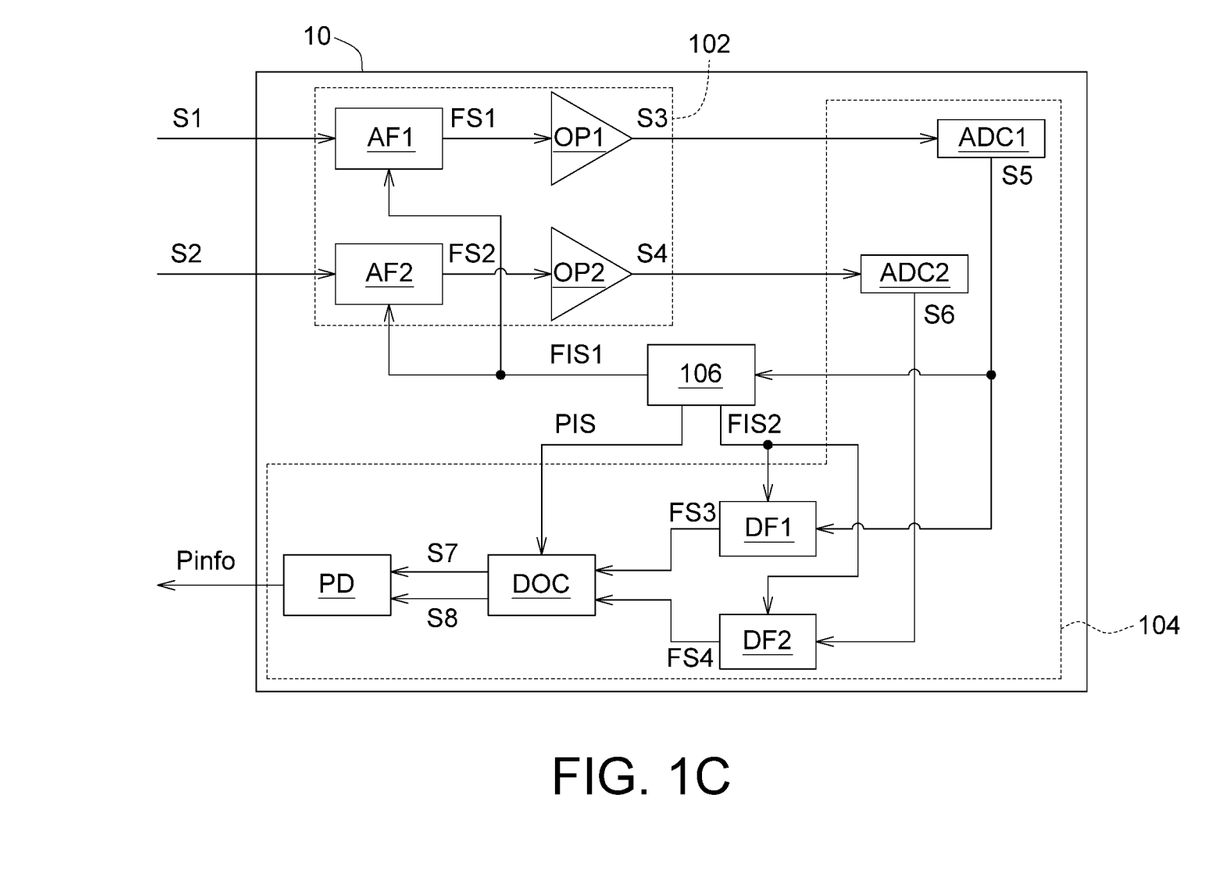
Figure 1D:
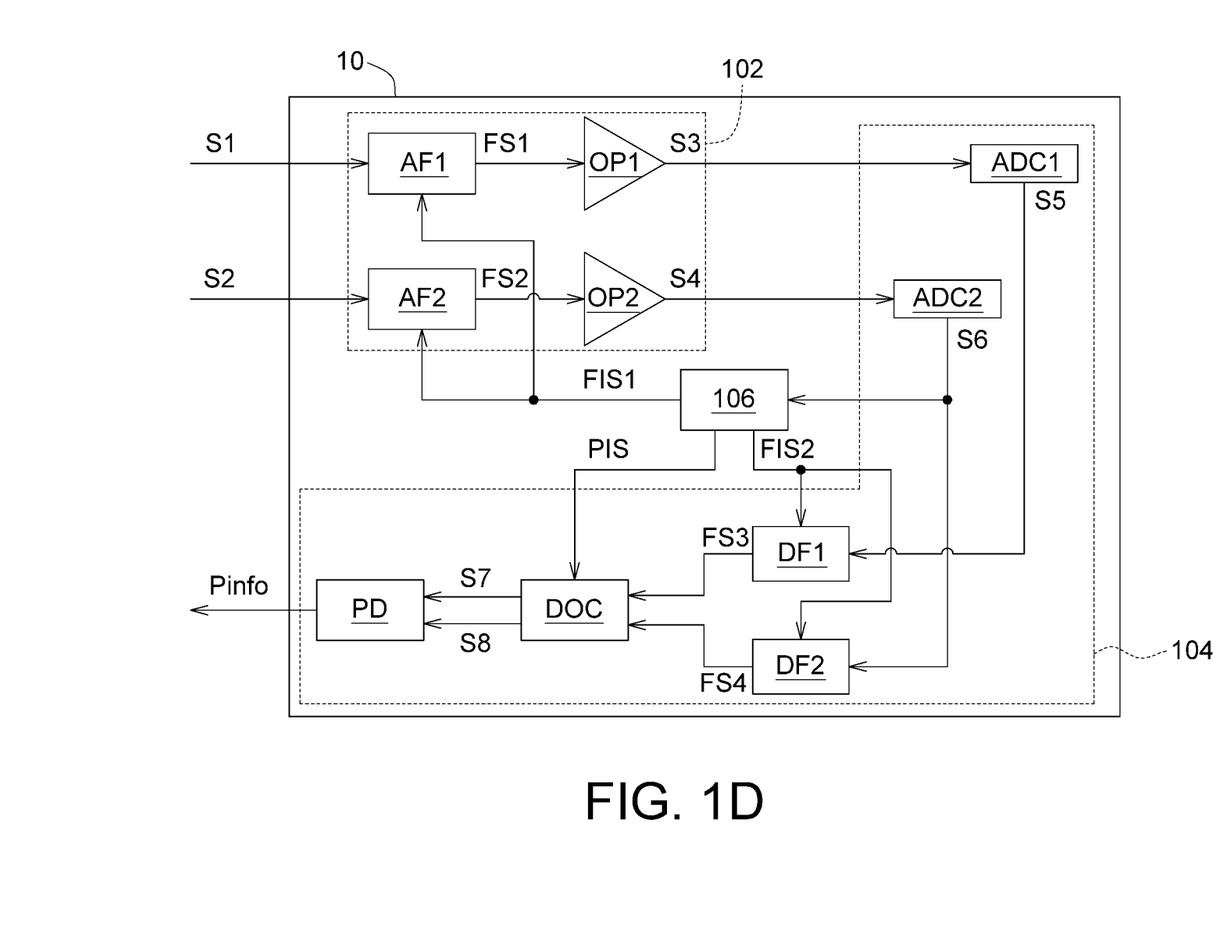

In an alternate embodiment as indicated in FIG. 1B, the frequency generation module 106 may also output the first frequency indication signal FIS1, the second frequency indication signal FIS2 and the period indication signal PIS according to the third signal S3. In an alternate embodiment as indicated in FIGS. 1C and 1D, the frequency generation module 106 may also output the first frequency indication signal FIS1, the second frequency indication signal FIS2 and the period indication signal PIS according to the fifth signal S5 or the sixth signal S6. In an embodiment as indicated in FIGS. 1C and 1D, the frequency generation module 106 has a signal input end coupled between the first analog-to-digital converter ADC1 and the first digital filter DF1 or between the second analog-to-digital converter ADC2 and the second digital filter DF2.

Figure 2C:
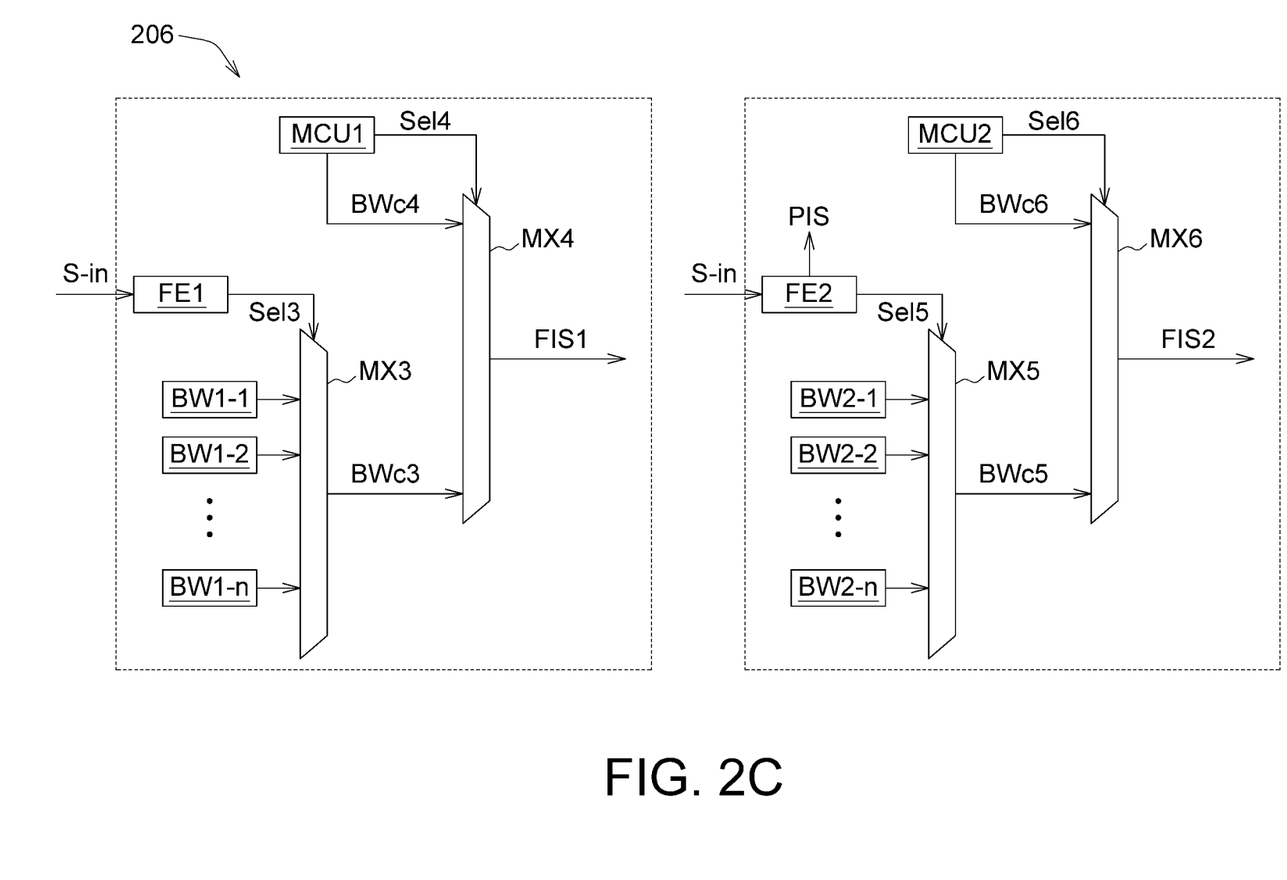
FIG. 2C is a block diagram of a frequency generation module according to another embodiment of the present application.

Referring to FIG. 2C, a block diagram of a frequency generation module according to another embodiment of the present application is shown. The frequency generation module 206 may replace the frequency generation module 106 of FIGS. 1A-1D. The frequency generation module 206 includes a first frequency estimator FE1, a first micro-controller MCU1, a second frequency estimator FE2, a second micro-controller MCU2, a third multiplexer MX3, a fourth multiplexer MX4, a fifth multiplexer MX5 and a sixth multiplexer MX6.

The first frequency estimator FE1 is configured to output the third selection signal Sel3 according to an input signal S-in (such as the third signal S3, the fourth signal S4, the fifth signal S5 or the sixth signal S6). The first micro-controller MCU1 is configured to generate a fourth selection signal Sel4 and a fourth candidate band BWc4. The third multiplexer MX3 is configured to select one of pleural first bands BW1-1~BW1-n as a third candidate band BWc3 according to the third selection signal Sel3. The fourth multiplexer MX4 is configured to select one of the third candidate band BWc3 and the fourth candidate band BWc4 according to the fourth selection signal Sel4, and to output the selected candidate band as the first frequency indication signal FIS1.

The second frequency estimator FE2 is configured to output the fifth selection signal Sel5 and the period indication signal PIS according to the input signal S-in (such as the third signal S3, the fourth signal S4, the fifth signal S5 or the sixth signal S6). The second micro-controller MCU2 is configured to generate a sixth selection signal Sel6 and a sixth candidate band BWc6. The fifth multiplexer MX5 is configured to select one of pleural second bands BW2-1~BW2-n as a fifth candidate band BWc5 according to the fifth selection signal Sel5. The sixth multiplexer MX6 is configured to select one of the fifth candidate band BWc5 and the sixth candidate band BWc6 according to the sixth selection signal Sel6, and to output the selected candidate band as the second frequency indication signal FIS2.

In an embodiment as indicated in FIG. 2C, the first band BW1-1~BW1-n and the second band BW2-1~BW2-n can be different or identical. The first frequency indication signal FIS1 and the second frequency indication signal FIS2 can be different or identical. In other words, the frequency generation module 206 can generate the first frequency indication signal FIS1 and the second frequency indication signal FIS2 with respect to the analog processing block and the digital processing block respectively. In actual application, the first frequency indication signal FIS1 is different from the second frequency indication signal FIS2, such that the filtering band of the first analog filter and the second analog filter is different from that of the first digital filter and the second digital filter. For example, the first analog filter and the second analog filter can filter the band of electric noises, and the first digital filter and the second digital filter can filter the frequency of mechanic noises or block the mechanic noises of a specific frequency.

Figure 4:
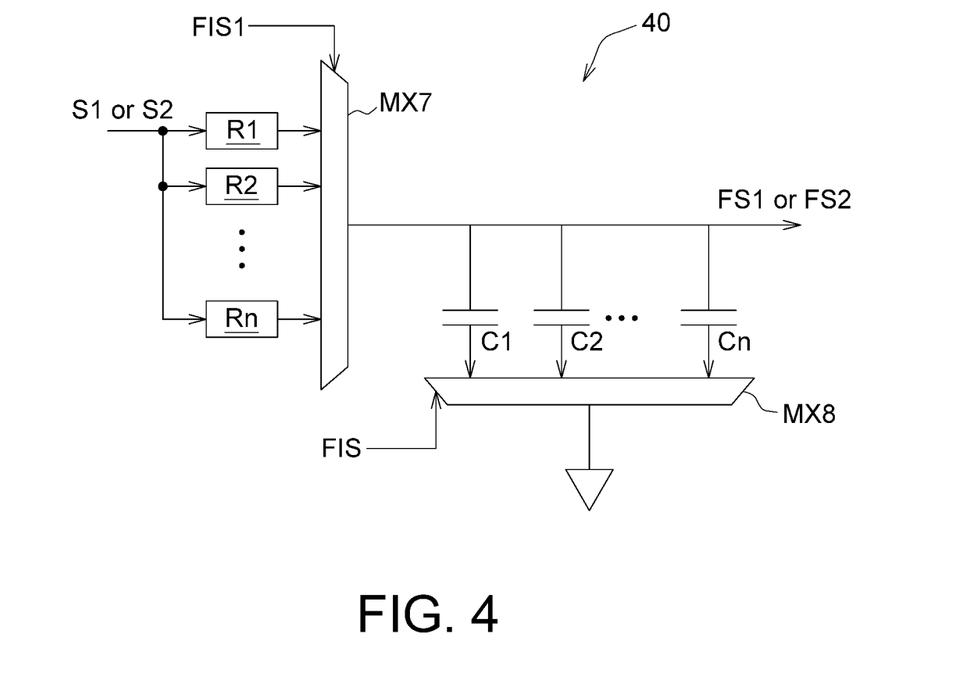
FIG. 4 is a block diagram of an analog filter according to an embodiment of the present application.

The first analog filter AF1 and the second analog filter AF2 can be implemented according to the block diagram of the analog filter as indicated in FIG. 4. The analog filter 40 may include pleural resistors R1~Rn, pleural capacitors C1~Cn, a seventh multiplexer MX7 and an eighth multiplexer MX8. The first signal S1 or the second signal S2 is inputted to resistors R1~Rn. The seventh multiplexer MX7 and the eighth multiplexer MX8 respectively select one of the resistors R1~Rn and one of the capacitors C1~Cn according to the first frequency indication signal FIS1 to from a filter circuit corresponding to the band indicated by the first frequency indication signal FIS1 and output the first filtered signal FS1 or the second filtered signal FS2.

Figure 5:
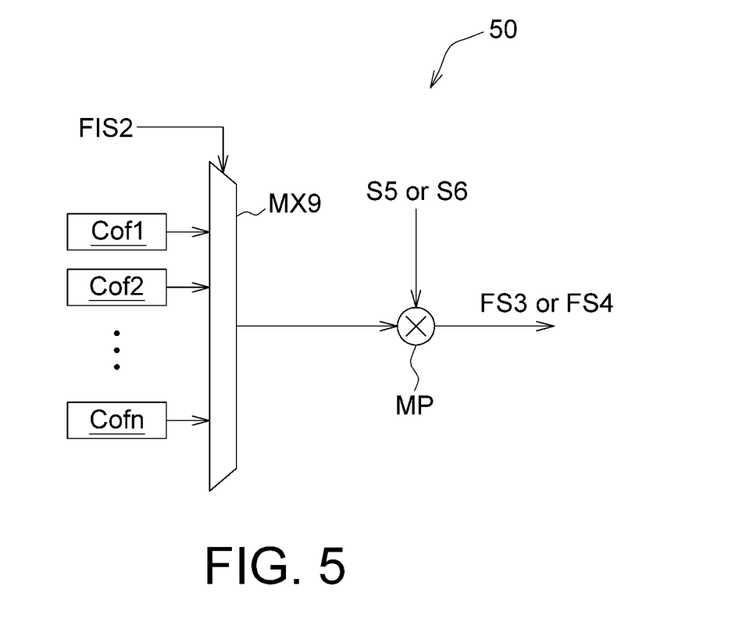
FIG. 5 is a block diagram of a digital filter according to an embodiment of the present application.

The first digital filter DF1 and the second digital filter DF2 can be implemented according to the block diagram of the digital filter as indicated in FIG. 5. The one or more digital filters 50 may include pleural the coefficient units Cof1~Cofn, a ninth multiplexer MX9 and a multiplication unit MP. The ninth multiplexer MX9 selects one of the coefficient units Cof1~Cofn according to the second frequency indication signal FIS2, and is coupled to the multiplication unit MP through the selected coefficient unit. The fifth signal S5 or the sixth signal S6 is inputted to the multiplication unit MP, and is multiplied by the coefficient of the selected one of the coefficient units Cof1~Cofn to output the third filtered signal FS3 or the fourth filtered signal FS4.

In other embodiments, the number of analog filters may vary with the number of analog signals inputted to the signal processing device. For example, if only 1 analog signal is inputted, then the number of analog filters and the number of digital filters are also 1. If more than 3 analog signals are inputted, then the number of analog filters and the number of digital filters may correspond to the number of analog signals, that is, more than 3.

Figure 6:
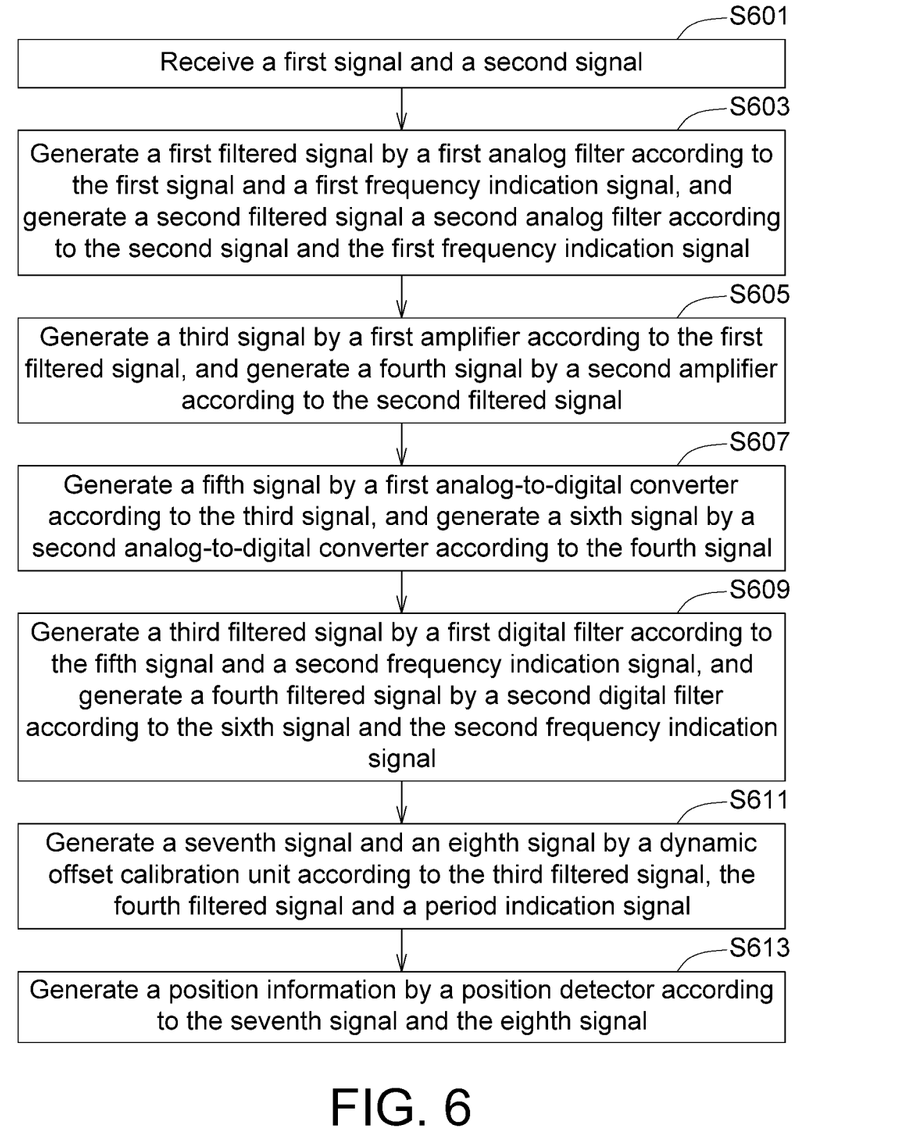
FIG. 6 is a flowchart of a signal processing method used in an encoder according to an embodiment of the present application.

Referring to FIG. 6, a flowchart of a signal processing method used in an encoder according to an embodiment of the present application is shown. The signal processing method can be performed by the encoder 10.

S601, a first signal and a second signal are received.

S603, a first filtered signal is generated by a first analog filter according to the first signal and a first frequency indication signal, and a second filtered signal is generated by a second analog filter according to the second signal and the first frequency indication signal.

S605, a third signal is generated by a first amplifier according to the first filtered signal, and a fourth signal is generated by a second amplifier according to the second filtered signal.

S607, a fifth signal is generated by a first analog-to-digital converter according to the third signal, and a sixth signal is generated by a second analog-to-digital converter according to the fourth signal.

S609, a third filtered signal is generated by a first digital filter according to the fifth signal and a second frequency indication signal, and a fourth filtered signal is generated by a second digital filter according to the sixth signal and the second frequency indication signal.

S611, a seventh signal and an eighth signal is generated by a dynamic offset calibration unit according to the third filtered signal, the fourth filtered signal and a period indication signal.

S613, a position information is generated by a position detector according to the seventh signal and the eighth signal.

Figure 7:
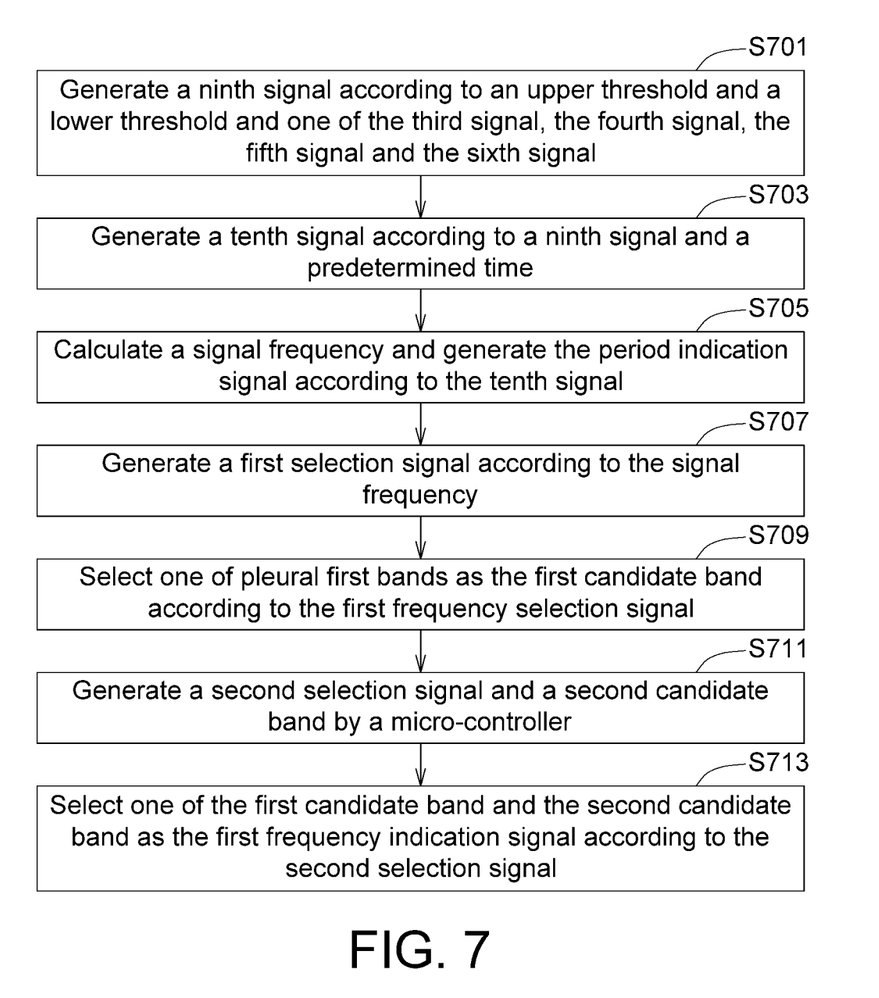
FIG. 7 is a flowchart of a frequency estimating method according to an embodiment of the present application.

Referring to FIG. 7, a flowchart of a frequency estimating method according to an embodiment of the present application is shown.

S701, a ninth signal is generated according to an upper threshold and a lower threshold and one of the third signal, the fourth signal, the fifth signal and the sixth signal.

S703, a tenth signal is generated according to a ninth signal and a predetermined time.

S705, a signal frequency is calculated and the period indication signal is generated according to the tenth signal.

S707, a first selection signal is generated according to the signal frequency.

S709, one of pleural first bands is selected as the first candidate band according to the first frequency selection signal.

S711, a second selection signal and a second candidate band are generated by a micro-controller.

S713, one of the first candidate band and the second candidate band is selected as the first frequency indication signal according to the second selection signal.

The second frequency indication signal can also be generated by the above method.

Details of each step of FIG. 6 and FIG. 7 can be obtained with reference to above explanations, and are not repeated here.

Noted that the signals (e.g., the first filtered signal FS1 and the second filtered signal FS2) output by the analog filters (e.g., the first analog filters AF1 and the second analog filters AF2) are filtered analog signals, and the signals (e.g., the third filtered signal FS3 and the fourth filtered signal FS4) output by the digital filters (e.g., the first digital filters DF1 and the second digital filters DF2) are filtered digital signals.

To summarize, the signal processing device and the signal processing method disclosed in the present application are capable of estimating a signal frequency of an input signal (such as a first signal and a second signal) currently inputted to the signal processing device by a frequency generation module, and selecting an appropriate band according to the signal frequency to generate a frequency indication signal. The frequency indication signal can be used to indicate a filter band used and dynamically adjusted by an analog filter and a digital filter of the signal processing device in response to the current input signal to effectively reduce the influence of noises on the encoder.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An encoder, comprising:
   one or more analog filters configured to receive one or more analog signals, and to generate one or more filtered analog signals according to the one or more analog signals and a first frequency indication signal;
   one or more analog-to-digital converters configured to generate one or more digital signals according to the one or more filtered analog signals;
   one or more digital filters configured to generate one or more filtered digital signals according to the one or more digital signals and a second frequency indication signal;
   a dynamic offset calibration unit configured to generate a seventh signal and an eighth signal according to the one or more filtered digital signals and a period indication signal;

a position detection unit configured to generate a position information according to the seventh signal and the eighth signal; and a frequency generation module configured to generate the first frequency indication signal, the second frequency indication signal and the period indication signal according to an input signal, which is one of the filtered analog signals or one of the digital signals.

2. The encoder according to claim 1, wherein the frequency generation module comprises:

a frequency estimator configured to generate a first selection signal and the period indication signal according to the input signal;

a first multiplexer configured to select one of a plurality of first bands as a first candidate band according to the first selection signal;

a micro-controller configured to generate a second selection signal and a second candidate band; and a second multiplexer configured to select one of the first candidate band and the second candidate band as the first frequency indication signal and the second frequency indication signal according to the second selection signal.

3. The encoder according to claim 2, wherein the frequency estimator comprises:

a hysteresis unit configured to generate a ninth signal according to the input signal, an upper threshold and a lower threshold;

a glitch removal unit configured to generate a tenth signal according to the ninth signal and a predetermined time;

a frequency calculation unit configured to calculate a signal frequency according to the tenth signal and to generate the period indication signal; and a band hysteresis unit configured to select a band according to the signal frequency, and to generate the first selection signal according to the band.

4. The encoder according to claim 3, wherein in the hysteresis unit, when the input signal is higher than the upper threshold, the ninth signal is a high level;

when the input signal is lower than the lower threshold, the ninth signal is a low level;

when the input signal changes from being higher than the upper threshold to be not higher than the upper threshold, the ninth signal maintains at the high level; and when the input signal changes from being lower than the lower threshold to be not lower than the lower threshold, the ninth signal maintains at the low level.

5. The encoder according to claim 3, wherein in the glitch removal unit, when the ninth signal changes from a high level to a low level and the low level lasts for the predetermined time, the tenth signal changes from the high level to the low level; and when the ninth signal changes from the low level to the high level and the high level lasts for the predetermined time, the tenth signal changes from the low level to the high level.

6. The encoder according to claim 1, wherein the one or more analog filters comprise a first analog filter and a second analog filter;

the one or more analog signals comprise a first signal and a second signal, one of the first signal and the second signal is a sine signal, and the other one of the first signal and the second signal is a cosine signal;

the one or more filtered analog signals comprise a first filtered signal and a second filtered signal, the first analog filter generates the first filtered signal according to the first signal and the first frequency indication signal, and the second analog filter generates the second filtered signal according to the second signal and the first frequency indication signal;

the one or more digital filters comprise a first digital filter and a second digital filter; and the one or more digital signals comprise a fifth signal and a sixth signal, the one or more filtered digital signals comprise a third filtered signal and a fourth filtered signal, the first digital filter generates the third filtered signal according to the fifth signal and the second frequency indication signal, and the second digital filter generates the fourth filtered signal according to the sixth signal and the second frequency indication signal.

7. The encoder according to claim 1, wherein the frequency generation module comprises:

a first frequency estimator configured to generate a third selection signal according to the input signal;

a third multiplexer configured to select one of a plurality of first bands as a first candidate band according to the third selection signal;

a first micro-controller configured to generate a fourth selection signal and a fourth candidate band;

a fourth multiplexer configured to select one of a third candidate band and the fourth candidate band as the first frequency indication signal according to the fourth selection signal;

a second frequency estimator configured to generate a fifth selection signal and the period indication signal according to the input signal;

a fifth multiplexer configured to select one of a plurality of second bands as a fifth candidate band according to the fifth selection signal;

a second micro-controller configured to generate a sixth selection signal and a sixth candidate band; and a sixth multiplexer configured to select one of the fifth candidate band and the sixth candidate band as the second frequency indication signal according to the sixth selection signal.

8. The encoder according to claim 7, wherein the first frequency estimator and the second frequency estimator respectively comprise:

a hysteresis unit configured to generate a ninth signal according to the input signal, an upper threshold and a lower threshold;

a glitch removal unit configured to generate a tenth signal according to the ninth signal and a predetermined time;

a frequency calculation unit configured to calculate a signal frequency according to the tenth signal; and a band hysteresis unit configured to select a band according to the signal frequency, and to generate a first selection signal or a second selection signal according to the band, wherein the period indication signal is generated by the frequency calculation unit of the second frequency estimator according to the tenth signal.

9. The encoder according to claim 8, wherein in each of the hysteresis units, when the input signal is higher than the upper threshold, the ninth signal is a high level;

when the input signal is lower than the lower threshold, the ninth signal is a low level;

when the input signal changes from being higher than the upper threshold to be not higher than the upper threshold, the ninth signal maintains at the high level; and when the input signal changes from being lower than the lower threshold to be not lower than the lower threshold, the ninth signal maintains at the low level.

10. The encoder according to claim 8, wherein in each of the glitch removal units, when the ninth signal changes from a high level to a low level and the low level lasts for the predetermined time, the tenth signal changes from the high level to the low level; and when the ninth signal changes from the low level to the high level and the high level lasts for the predetermined time, the tenth signal changes from the low level to the high level.

11. A signal processing method using an encoder, comprising:

receiving one or more analog signals by one or more analog filters, and generating one or more filtered analog signals by the same according to the one or more analog signals and a first frequency indication signal;

generating one or more digital signals by one or more analog-to-digital converters according to the one or more filtered analog signals;

generating one or more filtered digital signals by one or more digital filters according to the one or more digital signals and a second frequency indication signal;

generating a seventh signal and an eighth signal by a dynamic offset calibration unit according to the one or more filtered digital signals and a period indication signal; and generating a position information by a position detection unit according to the seventh signal and the eighth signal, wherein the first frequency indication signal and the second frequency indication signal are generated by a frequency generation module according to an input signal, which is one of the filtered analog signals or one of the digital signals.

12. The signal processing method according to claim 11, wherein the step of generating the first frequency indication signal and the second frequency indication signal by the frequency generation module comprises:

generating a first selection signal and the period indication signal by a frequency estimator according to the input signal;

selecting one of a plurality of first bands as a first candidate band by a first multiplexer according to the first selection signal;

generating a second selection signal and a second candidate band by a micro-controller; and selecting one of the first candidate band and the second candidate band as the first frequency indication signal and the second frequency indication signal by a second multiplexer according to the second selection signal.

13. The signal processing method according to claim 12, wherein the step of generating a first selection signal and the period indication signal by a frequency estimator according to the input signal comprises:

generating a ninth signal by a hysteresis unit according to the input signal, an upper threshold and a lower threshold;

generating a tenth signal by a glitch removal unit according to the ninth signal and a predetermined time;

calculating a signal frequency and generating the period indication signal by a frequency calculation unit according to the tenth signal; and selecting a band by a band hysteresis unit according to the signal frequency, and generating the first selection signal by the same according to the band.

14. The signal processing method according to claim 13, wherein, when the input signal is higher than the upper threshold, the ninth signal is a high level;

when the input signal is lower than the lower threshold, the ninth signal is a low level;

when the input signal changes from being higher than the upper threshold to be not higher than the upper threshold, the ninth signal maintains at the high level; and when the input signal changes from being lower than the lower threshold to be not lower than the lower threshold, the ninth signal maintains at the low level.

15. The signal processing method according to claim 13, wherein when the ninth signal changes from a high level to a low level and the low level lasts for the predetermined time, the tenth signal changes from the high level to the low level; and when the ninth signal changes from the low level to the high level and the high level lasts for the predetermined time, the tenth signal changes from the low level to the high level.

16. The signal processing method according to claim 11, wherein the step of generating the first frequency indication signal and the second frequency indication signal by the frequency generation module comprises:

generating a third selection signal by a first frequency estimator according to the input signal;

selecting one of a plurality of first bands as a third candidate band by a third multiplexer according to the third selection signal;

generating a fourth selection signal and a fourth candidate band by a first micro-controller;

selecting one of the third candidate band and the fourth candidate band as the first frequency indication signal by a fourth multiplexer according to the fourth selection signal;

generating a fifth selection signal and the period indication signal by a second frequency estimator according to the input signal;

selecting one of a plurality of second bands as a fifth candidate band by a fifth multiplexer according to the fifth selection signal;

generating a sixth selection signal and a sixth candidate band by a second micro-controller; and selecting one of the fifth candidate band and the sixth candidate band as the second frequency indication signal by a sixth multiplexer according to the sixth selection signal.

17. The signal processing method according to claim 16, wherein the step of generating the third selection signal by the first frequency estimator according to the input signal comprises:

generating a ninth signal by a hysteresis unit according to the input signal, an upper threshold and a lower threshold;

generating a tenth signal by a glitch removal unit according to the ninth signal and a predetermined time;

calculating a signal frequency by a frequency calculation unit according to the tenth signal; and selecting a band by a band hysteresis unit according to the signal frequency, and generating the first selection signal by the same according to the band.

18. The signal processing method according to claim 16, wherein the step of generating the fourth selection signal and the period indication signal by the second frequency estimator according to the input signal comprises:

generating a ninth signal by a hysteresis unit according to the input signal, an upper threshold and a lower threshold;

generating a tenth signal by a glitch removal unit according to the ninth signal and a predetermined time;

calculating a signal frequency by a frequency calculation unit according to the tenth signal and generating the period indication signal by the same; and selecting a band by a band hysteresis unit according to the signal frequency, and generating a second selection signal by the same according to the band.

19. The signal processing method according to claim 17, wherein when the input signal is higher than the upper threshold, the ninth signal is a high level;

when the input signal is lower than the lower threshold, the ninth signal is a low level;

when the input signal changes from being higher than the upper threshold to be not higher than the upper threshold, the ninth signal maintains at the high level; and when the input signal changes from being lower than the lower threshold to be not lower than the lower threshold, the ninth signal maintains at the low level.

20. The signal processing method according to claim 18, wherein when the input signal is higher than the upper threshold, the ninth signal is a high level;

when the input signal is lower than the lower threshold, the ninth signal is a low level;

when the input signal changes from being higher than the upper threshold to be not higher than the upper threshold, the ninth signal maintains at the high level; and when the input signal changes from being lower than the lower threshold to be not lower than the lower threshold, the ninth signal maintains at the low level.

21. The signal processing method according to claim 17, wherein when the ninth signal changes from a high level to a low level and the low level lasts for the predetermined time, the tenth signal changes from the high level to the low level; and when the ninth signal changes from the low level to the high level and the high level lasts for the predetermined time, the tenth signal changes from the low level to the high level.

22. The signal processing method according to claim 18, wherein when the ninth signal changes from a high level to a low level and the low level lasts for the predetermined time, the tenth signal changes from the high level to the low level; and when the ninth signal changes from the low level to the high level and the high level lasts for the predetermined time, the tenth signal changes from the low level to the high level.

\* \* \* \* \*